(12) United States Patent
Liao et al.

(10) Patent No.: US 8,928,126 B2
(45) Date of Patent: Jan. 6, 2015

(54) EPITAXIAL LAYER

(71) Applicant: United Microelectronics Corp., Hsin-Chu (TW)

(72) Inventors: Chin-I Liao, Tainan (TW); Chin-Cheng Chien, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 13/670,476

(22) Filed: Nov. 7, 2012

(65) Prior Publication Data

US 2014/0124904 A1 May 8, 2014

(51) Int. Cl.
*H01L 21/02* (2006.01)

(52) U.S. Cl.
USPC ............ 257/655; 257/E21.092; 257/E21.102; 257/E21.115

(58) Field of Classification Search
CPC . H01L 21/22; H01L 21/2205; H01L 21/2053; H01L 21/2033; H01L 21/2018; H01L 21/36
USPC ............ 257/655, E21.092, E21.102, E21.115
See application file for complete search history.

(56) References Cited

U.S. PATENT DOCUMENTS

| | | | | |
|---|---|---|---|---|
| 7,538,387 | B2 * | 5/2009 | Tsai | 257/327 |
| 8,378,424 | B2 * | 2/2013 | Dube et al. | 257/365 |
| 8,466,045 | B2 * | 6/2013 | Gumpher et al. | 438/478 |
| 2009/0224339 | A1 * | 9/2009 | Gogoi et al. | 257/413 |
| 2010/0320546 | A1 | 12/2010 | Tamura | |
| 2011/0180848 | A1 | 7/2011 | Ramdani | |
| 2012/0068193 | A1 * | 3/2012 | Chan et al. | 257/77 |

OTHER PUBLICATIONS

Anteney, Electrical properties of in situ phosphorus- and boron-doped polycrystalline SiGeC films, Jul. 24, 2000.

* cited by examiner

*Primary Examiner* — Tan N Tran
(74) *Attorney, Agent, or Firm* — Winston Hsu; Scott Margo

(57) ABSTRACT

A method of forming an epitaxial layer includes the following steps. At first, a first epitaxial growth process is performed to form a first epitaxial layer on a substrate, and a gas source of silicon, a gas source of carbon, a gas source of phosphorous and a gas source of germanium are introduced during the first epitaxial growth process to form the first epitaxial layer including silicon, carbon, phosphorous and germanium. Subsequently, a second epitaxial growth process is performed to form a second epitaxial layer, and a number of elements in the second epitaxial layer is smaller than a number of elements in the first epitaxial layer.

8 Claims, 3 Drawing Sheets

EPITAXIAL LAYER

BACKGROUND OF THE INVENTION

1. Field of the Invention

The present invention relates to an epitaxial layer and a method of forming an epitaxial layer, and more particularly to an epitaxial layer including silicon, carbon, phosphorous and germanium and a method of forming the same.

2. Description of the Prior Art

With the trend of miniaturization of semiconductor device dimensions, the scale of the gate, source and drain of a transistor has dropped in accordance with the reduction of the critical dimension (CD). Due to the physical limitation of the materials used, the decrease of the gate, source and drain scale results in the diminution of the number of carriers that determine the magnitude of the current in the transistor element, which can adversely affect its performance. Accordingly, in order to boost up a metal-oxide-semiconductor (MOS) transistor, increasing the carrier mobility is an important consideration in the field of current semiconductor technique.

In the conventional technologies, a strained semiconductor substrate is used to provide biaxial tensile stresses to increase the carrier mobility. A silicon-germanium (SiGe) layer is formed on the silicon substrate, and a silicon layer is further formed on the SiGe layer to constitute the strained semiconductor substrate. The lattice constant of silicon (Si) is 5.431 angstroms (A), and the lattice constant of germanium (Ge) is 5.646 A. When the silicon layer is disposed on the SiGe layer, lateral stress is induced in the silicon layer due to the lattice constant difference, so this silicon layer can serve as a strained silicon layer. The strained silicon layer facilitates the formation of a gate dielectric layer of high quality, and provides stress to the channel region of a transistor for enhancing carrier mobility. Furthermore, a selective epitaxial growth (SEG) process can also be used to form a strained silicon layer; after the formation of the gate, a silicon-germanium (SiGe) layer is further formed in the predetermined location of the source/drain region at two sides of the gate structure to provide compressive stress in order to boost up a PMOS transistor; or a silicon-carbide (SiC) layer is further formed in the predetermined location of the source/drain region at two sides of the gate structure to provide tensile stress in order to boost up a NMOS transistor.

A source/drain region of a NMOS transistor includes n-type dopant doped strained silicon layer such as phosphorous (P) doped silicon-carbide layer. The atomic radius of phosphorous (1.26 angstroms) and the atomic radius of carbon (0.91 angstroms) are smaller than the atomic radius of silicon (1.46 angstroms), so phosphorous doped silicon-carbide layer may not be formed properly on the (111) crystallographic planes of the silicon wafer due to the atomic radius difference. Therefore, the recesses at two sides of the gate structure may not be filled up with the phosphorous doped silicon-carbide layer to form the complete source/drain region, which adversely affect the performance of the NMOS transistor. Consequently, how to improve an epitaxial layer process for forming an epitaxial layer including elements having different atomic radiuses is still an important issue in this field.

SUMMARY OF THE INVENTION

It is therefore one of the objectives of the present invention to provide an epitaxial layer including elements having different atomic radiuses, and a method of forming the epitaxial layer in order to obtain the predetermined shape of the epitaxial layer so as to improve the semiconductor device performance.

According to an exemplary embodiment of the present invention, a method of forming an epitaxial layer includes the following steps. At first, a first epitaxial growth process is performed to form a first epitaxial layer on a substrate, and a gas source of silicon, a gas source of carbon, a gas source of phosphorous and a gas source of germanium are introduced during the first epitaxial growth process to form the first epitaxial layer including silicon, carbon, phosphorous and germanium. Subsequently, a second epitaxial growth process is performed to form a second epitaxial layer, and a number of elements in the second epitaxial layer is smaller than a number of elements in the first epitaxial layer.

According to another exemplary embodiment of the present invention, an epitaxial layer is provided. The epitaxial layer includes a first epitaxial layer and a second epitaxial layer. The first epitaxial layer includes silicon, carbon, phosphorous and germanium. Furthermore, the second epitaxial layer is disposed on the first epitaxial layer, and a number of elements in the second epitaxial layer is smaller than a number of elements in the first epitaxial layer.

An element such as germanium (Ge) having an atomic radius substantially around the same size as the atomic radius of silicon (Si) is doped into phosphorous doped silicon-carbide (SiCP) layer to form an epitaxial layer simultaneously including silicon, carbon, phosphorous and germanium, in order to compensate lattice mismatches due to the atomic difference between silicon and carbon and between silicon and phosphorous. Hence, the epitaxial layer having four elements can be formed properly on the (111) crystallographic planes of the silicon wafer, and the predetermined shape of the epitaxial layer may be obtained. Moreover, the epitaxial layer process can be applied to the source/drain process to improve the metal-oxide-semiconductor (MOS) transistor performance.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention, preferred exemplary embodiments will be described in detail.

The preferred exemplary embodiments of the present invention are illustrated in the accompanying drawings with numbered elements.

Figure 1:
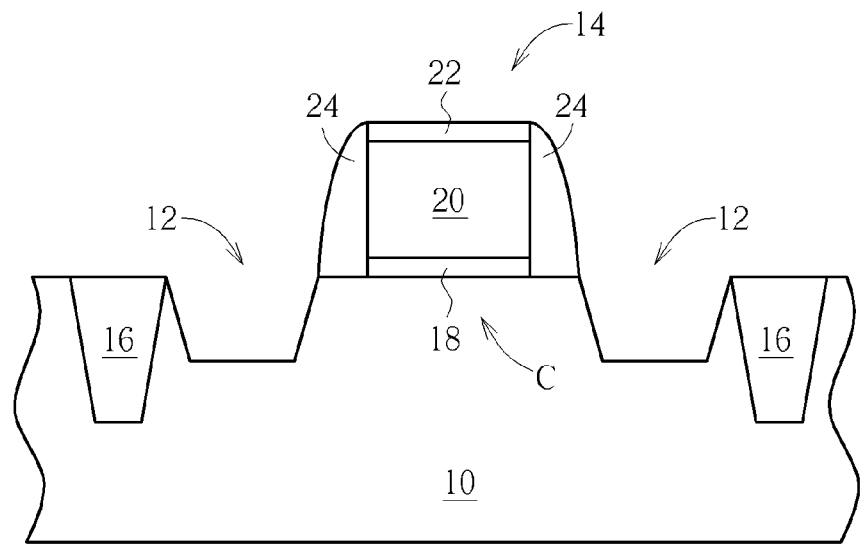
FIG. 1 through FIG. 2 illustrate a method of forming an epitaxial layer according to an exemplary embodiment of the present invention.
Figure 2:
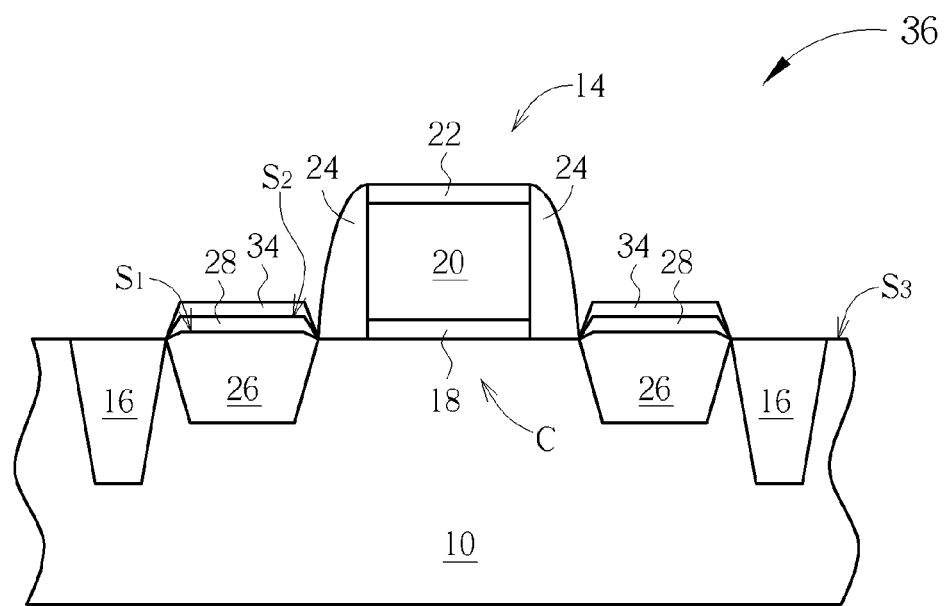

Please refer to FIG. 1 through FIG. 2. FIG. 1 through FIG. 2 illustrate a method of forming an epitaxial layer according to an exemplary embodiment of the present invention. As shown in FIG. 1, a substrate 10 is provided, and the substrate 10 includes at least a recess 12. The substrate 10 could be a substrate composed of arsine-gallium (AsGa), silicon on insulator (SOI) layer, epitaxial layer, silicon-germanium (SiGe) layer or other semiconductor material. The substrate 10 may further include at least a gate structure 14 and at least a shallow trench isolation (STI) 16, and the recess 12 is located in the active region between the gate structure 14 and the STI 16. The gate structure 14 includes a gate dielectric layer 18, a gate conductive layer 20 disposed on the gate dielectric layer 18, and a cap layer 22 disposed on the gate conductive layer 20. The gate dielectric layer 18 could be made of insulating materials such as silicon oxide, silicon oxynitride formed through thermal oxidation process or deposition process, or other high-k gate dielectric layer with a dielectric constant larger than 4. The gate conductive layer 20 may include conductive materials such as polysilicon, metal silicide or metal layer with specific work functions. The cap layer 22 can be made of insulating materials such as silicon nitride, silicon oxide, or silicon oxynitride. The STI 16 may include dielectric materials such as silicon oxide. As the gate structure processes and the STI processes are known to those skilled in the art, the details are omitted herein for brevity.

The method of forming the recess 12 includes the following steps. At first, a first spacer 24 is selectively formed on the sides of each gate structure 14. Subsequently, an anisotropic dry etching process is performed to form the recesses 12 in the substrate 10 at each of the two sides of the gate structure 14, in which the formed gate structure 14 and the formed first spacer 24 are used as masks. Additionally, it is also possible to combine a dry etching process with a wet etching process to form the recesses 12 with various shapes such as barrel shape, hexagon, or polygon. This way, greater stress can be induced and provided to the channel region C by the epitaxial layers in the recesses 12. The first spacer 24 may include a monolayer structure or a multilayer structure made of silicon oxide, silicon nitride, or a combination thereof, or other appropriate materials, moreover; the first spacer 24 could be a disposable spacer; that is, the first spacer 24 could be partially or totally removed after a later epitaxial growth process, but not limited thereto. Furthermore, another monolayered or multilayered spacer could also be selectively formed between the first spacer 24 and the gate structure 14.

To form the high quality epitaxial layer in the recess 12, before further epitaxial growth processes, a pre-clean step is first performed. For example, a clean solution such as dilute hydrofluoric acid (DHF) solution, or a SPM solution including sulfuric acid ($H_2SO_4$), hydrogen peroxide ($H_2O_2$) and deionized water (DI water), is used to remove impurities such as native oxide layer upon the surface of the recess 12. Besides, a pre-bake step could also be implemented; for example, the substrate 10 is heated in a chamber with hydrogen introduced into to remove the native oxide layer upon the surface of the recess 12 or the residual clean solution.

As shown in FIG. 2, a first epitaxial growth process is performed to form a first epitaxial layer 26 on a substrate 10. The first epitaxial growth process includes an in-situ epitaxial growth process. More specifically, the element source gases including a gas source of silicon (Si), a gas source of carbon (C), a gas source of phosphorous (P) and a gas source of germanium (Ge), and a carrier gas such as nitrogen gas ($N_2$) and hydrogen gas ($H_2$) are simultaneously introduced into a reaction chamber under a specific operation pressure substantially between 10 and 50 torr. In other words, germanium is doped into the silicon-carbon-phosphorous (SiCP) epitaxial layer during the formation of SiCP epitaxial layer, to directly form the first epitaxial layer 26 including four elements such as silicon (Si), carbon (C), phosphorous (P) and germanium (Ge) in the recesses 12. The gas source of silicon may include dichlorosilane (DCS) or a branched silane that follows the empirical formula $Si_xH_{2x+2}$, x>1, such as silane ($SiH_4$) or disilane ($Si_2H_6$). The gas source of carbon may include monomethyl silane (MMS, $Si(CH_3)H_3$) or organosilane that follows the empirical formula $Si(CH_3)_xH_{4-x}$, x>1. The gas source of phosphorous may include phosphine ($PH_3$). The gas source of germanium may include germane ($GeH_4$). It is appreciated that a material of the first epitaxial layer 26 can be denoted as ($SiC_xP_yGe_z$). Germanium having an atomic radius (1.52 angstroms) substantially around the atomic radius of silicon (1.46 angstroms), compared to the conventional epitaxial layer that only includes silicon, carbon, phosphorous, the first epitaxial layer 26 further including germanium may be beneficial for compensating lattice mismatches due to the atomic difference between the different elements, for example between silicon and carbon, and between silicon and phosphorous. Thus, the first epitaxial layer 26 having these four elements can be formed properly on the (111) crystallographic planes of the silicon wafer. Additionally, in order to provide tensile stress, the doped concentration of carbon may be substantially larger than the doped concentration of germanium. Accordingly, in the material of the first epitaxial layer 26, i.e. ($SiC_xP_yGe_z$), a value of x is preferably substantially larger than a value of z. In this exemplary embodiment, the doped concentration of carbon is larger than 0, the doped concentration of phosphorous is substantially equal to or larger than 5E19 $cm^{-3}$, the doped concentration of germanium is substantially larger than 1E18 $cm^{-3}$, and the doped concentration of carbon is substantially larger than the doped concentration of germanium, and the first epitaxial layer 26 may provide tensile stress to the channel region C.

In one exemplary embodiment, the first epitaxial growth process could be a co-flow deposition process. More specifically, during the deposition process, the element source gases and the carrier gases as illustrated above and the etching gases such as hydrogen chloride (HCl) are simultaneously introduced into the reaction chamber. During the formation of the epitaxial layer, the etching process is performed simultaneously to remove a part of the formed epitaxial layer. In another exemplary embodiment, the first epitaxial growth process could be a cyclic deposition process. More specifically, the element source gases and the etching gases are alternately introduced into the reaction chamber and accompanied by the carrier gases. The deposition process and the etching process are then performed alternately and repeatedly many times. Moreover, after the co-flow deposition process or during the cyclic deposition process, a cleaning process can be further performed; for example, the reaction chamber can be washed by the carrier gases or other kinds of gases, and/or the reaction chamber can be evacuated by the vacuum pump, in order to remove excess of element source gases, by-products and pollutants. Furthermore, after forming the SiCPGe epitaxial layer, an ion implantation process can be further performed to implant the conductive dopants such as n-type conductive dopant including phosphorous ions into the SiCPGe epitaxial layer, and a part of the first epitaxial layer 26 may serve as a doped source/drain region.

Subsequently, a second epitaxial growth process is performed to form a second epitaxial layer 28 on the first epitaxial layer 26, and a number of elements in the second epitaxial layer 28 is smaller than a number of elements in the first epitaxial layer 26. In other words, a number of element source gases introduced when the second epitaxial growth process is performed is smaller than a number of the element source gases introduced when the first epitaxial growth process is performed, and a number of the element types in the second epitaxial layer 28 is smaller than a number of the element types in the first epitaxial layer 26. More specifically, the second epitaxial growth process includes an in-situ epitaxial growth process, and the element source gases including the gas source of silicon (Si) and the gas source of phosphorous (P) are simultaneously introduced into a reaction chamber under a specific operation pressure substantially between 10 and 50 torr during the second epitaxial growth process to form the second epitaxial layer 28 including silicon and phosphorous. The gas source of silicon and the gas source of phosphorous are as illustrated above, which are omitted herein for brevity. The disposition of the second epitaxial layer 28 may prevent germanium of the first epitaxial layer 26 from diffusing upward and reaching a surface of the substrate 10 during later processes such as metal silicide process, for example, nickel silicide process, so the performance of later formed semiconductor devices such as NMOS can be improved.

In other exemplary embodiments, if the performances of the later formed semiconductor devices don't correspond to the out-diffusing of germanium, the gas source of silicon, the gas source of phosphorous and the gas source of germanium are simultaneously introduced during the second epitaxial growth process to serve as an in-situ epitaxial growth process and form the second epitaxial layer including three elements such as silicon, phosphorous and germanium. Furthermore, after forming the second epitaxial layer 28 made of the SiP epitaxial layer, an ion implantation process can be further performed to implant the conductive dopants such as n-type conductive dopant including phosphorous ion into the second epitaxial layer 28 to serve as a doped source/drain region.

In this exemplary embodiment, the first epitaxial layer 26 fills the recesses 12, and a surface S1 of the first epitaxial layer 26 and a surface S2 of the second epitaxial layer 28 are above the surface S3 of the substrate 10, so as to increase the stresses provided to the channel region C by the first epitaxial layer 26 and the second epitaxial layer 28, but not limited thereto.

The material of the strained silicon layer can be adjusted according to the characteristic requirements of the later formed semiconductor device, therefore, in addition to the first epitaxial growth process and the second epitaxial growth process, a third epitaxial growth process is performed to form a third epitaxial layer. The corresponding embodiments are illustrated as below.

The First Exemplary Embodiment

Figure 3:
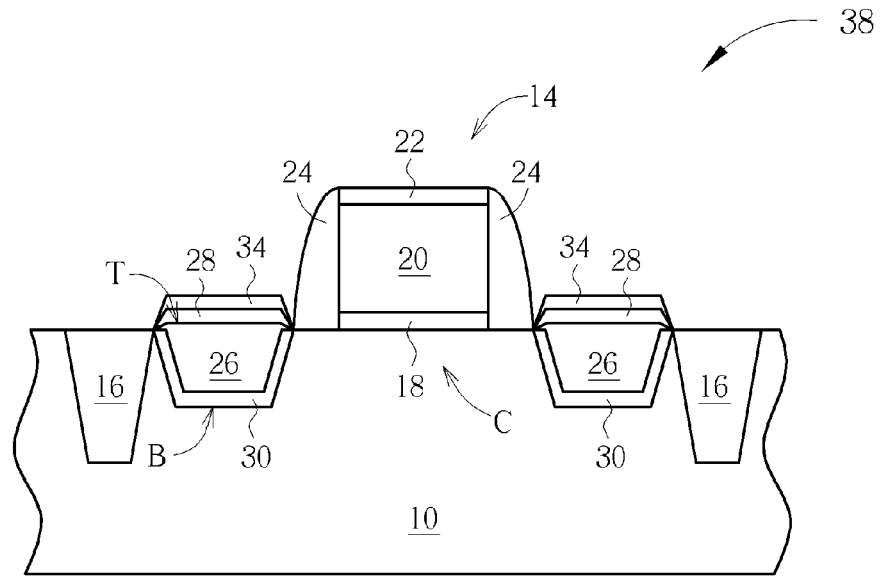
FIG. 3 illustrates a method of forming an epitaxial layer according to an exemplary embodiment of the present invention.

Please refer to FIG. 3. FIG. 3 illustrates a method of forming an epitaxial layer according to an exemplary embodiment of the present invention. As shown in FIG. 3, at first, the third epitaxial growth process including an in-situ epitaxial growth process is performed, and a number of element source gases introduced during the third epitaxial growth process is smaller than a number of the element source gases introduced during the first epitaxial growth process. For example, the gas source of silicon (Si), the gas source of carbon (C) and the gas source of phosphorous (P) are simultaneously introduced into a reaction chamber under a specific operation pressure substantially between 10 and 50 torr to form the third epitaxial layer 30 including three elements, such as silicon (Si), carbon (C) and phosphorous (P) in the recesses 12. A number of elements in the third epitaxial layer 30 is smaller than a number of elements in the first epitaxial layer 26. The gas source of silicon, the gas source of carbon and the gas source of phosphorous are as illustrated above, which are omitted herein for brevity. Subsequently, the first epitaxial growth process and the second epitaxial growth process illustrated above are sequentially performed.

The Second Exemplary Embodiment

Please refer to FIG. 3 again. As shown in FIG. 3, the epitaxial growth processes sequence in the second exemplary embodiment is the same as that in the first exemplary embodiment, and a number of elements in the third epitaxial layer 30 is smaller than a number of elements in the first epitaxial layer 26. The main difference is the type of element source gas used in the third epitaxial growth process. In the second exemplary embodiment, the gas source of silicon (Si), the gas source of carbon (C) and the gas source of germanium (Ge) are simultaneously introduced during the third epitaxial growth process to form the third epitaxial layer 30 including three elements such as silicon (Si), carbon (C) and germanium (Ge) in the recesses 12, while the gas source of phosphorous (P) is excluded. The gas source of silicon, the gas source of carbon and the gas source of germanium are as illustrated above, which are omitted herein for brevity.

The Third Exemplary Embodiment

Please refer to FIG. 3 again. As shown in FIG. 3, the epitaxial growth processes sequence and the types of element source gas used in the epitaxial growth processes in the third exemplary embodiment are the same as those in the second exemplary embodiment, and a number of elements in the third epitaxial layer 30 is smaller than a number of elements in the first epitaxial layer 26. The difference is that a flow rate of the gas source of carbon introduced during the first epitaxial growth process changes with time. Thus, the first epitaxial layer 26 has a graded doped concentration of carbon. More specifically, as the third epitaxial layer 30 is disposed under the first epitaxial layer 26, the doped concentration of carbon in the first epitaxial layer 26 increases progressively from the interface between the first epitaxial layer 26 and the third epitaxial layer 30 towards an interface between the first epitaxial layer 26 and the second epitaxial layer 28. For example, the doped concentration of carbon is fixed at substantially around 0.1% in the third epitaxial layer 30, and the first epitaxial layer 26 has a doped concentration distribution of carbon between 0.1% and 2.5%.

The Fourth Exemplary Embodiment

Please refer to FIG. 3 again. As shown in FIG. 3, the epitaxial growth processes sequence and the types of element source gas used in the epitaxial growth processes in the fourth exemplary embodiment are the same as those in the second exemplary embodiment, and a number of elements in the third epitaxial layer 30 is smaller than a number of elements in the first epitaxial layer 26. The difference is that a flow rate of the gas source of carbon introduced during the third epitaxial growth process changes with time. The third epitaxial layer 30 has therefore a graded doped concentration of carbon as well. More specifically, the doped concentration of carbon in the third epitaxial layer 30 increases progressively from a bottom B of the third epitaxial layer 30 towards an interface between the first epitaxial layer 26 and the third epitaxial layer 30. For example, the third epitaxial layer 30 has a doped concentration distribution of carbon between 0.1% and 2.5%, and the doped concentration of carbon in the first epitaxial layer 26 is fixed at substantially around 2.5%.

The Fifth Exemplary Embodiment

Please refer to FIG. 3 again. As shown in FIG. 3, the epitaxial growth processes sequence and the types of element source gas used in the epitaxial growth processes in the fifth exemplary embodiment are the same as those in the second exemplary embodiment, and a number of elements in the third epitaxial layer 30 is smaller than a number of elements in the first epitaxial layer 26. The difference is that a flow rate of the gas source of carbon introduced during the first epitaxial growth process and during the third epitaxial growth process all change with time. The first epitaxial layer 26 and the third epitaxial layer 30 therefore both have a graded doped concentration of carbon. More specifically, the doped concentration of carbon increases progressively from a bottom B of the third epitaxial layer 30 towards an interface between the first epitaxial layer 26 and the second epitaxial layer 28. For example, the doped concentration distribution of carbon is between 0.1% and 2.5% from the bottom B of the third epitaxial layer 30 to a top T of the first epitaxial layer 26.

The Sixth Exemplary Embodiment

Please refer to FIG. 3 again. As shown in FIG. 3, the conditions of the first epitaxial growth process and the third epitaxial growth process of the sixth exemplary embodiment are similar to those in the third exemplary embodiment, the fourth exemplary embodiment or the fifth exemplary embodiment. The difference is the type of element source gases used in the second epitaxial growth process. In the sixth exemplary embodiment, the gas source of silicon (Si), the gas source of phosphorous (P) and the gas source of germanium (Ge) are simultaneously introduced during the second epitaxial growth process such as an in-situ epitaxial growth process, i.e. the gas source of carbon (C) of the first epitaxial growth process is turned off, to form the second epitaxial layer 28 including three elements as silicon (Si), phosphorous (P) and germanium (Ge).

The Seventh Exemplary Embodiment

Figure 4:
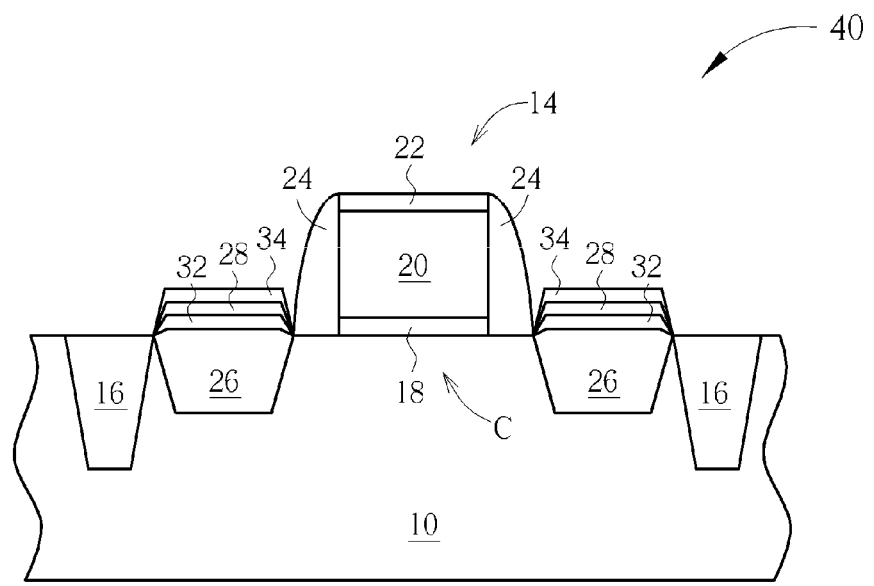
FIG. 4 illustrates a method of forming an epitaxial layer according to an exemplary embodiment of the present invention.

Please refer to FIG. 4. FIG. 4 illustrates a method of forming an epitaxial layer according to an exemplary embodiment of the present invention. As shown in FIG. 4, at first, the illustrated first epitaxial growth process is performed to form the first epitaxial layer 26. Subsequently, the third epitaxial growth process including an in-situ epitaxial growth process is performed, and the gas source of silicon (Si), the gas source of carbon (C) and the gas source of phosphorous (P) are simultaneously introduced to form the third epitaxial layer 32 including three elements such as silicon (Si), carbon (C) and phosphorous (P) in the recesses 12. Moreover, the second epitaxial growth process is performed, i.e. the gas source of carbon (C) of the third epitaxial growth process is turned off, to form the second epitaxial layer 28.

It is appreciated that, in the exemplary embodiments illustrated above, the number of elements in the second epitaxial layer 28 and the number of elements in the third epitaxial layer 30/32 are both smaller than the number of elements in the first epitaxial layer 26. In other words, a number of element source gases introduced during the second epitaxial growth process and during the third epitaxial growth process are both smaller than a number of the element source gases introduced during the first epitaxial growth process.

To protect the formed epitaxial layers, a fourth epitaxial growth process is selectively performed to form a fourth epitaxial layer 34 on the second epitaxial layer 28, and only the gas source of silicon (Si) is introduced during the fourth epitaxial growth process. Accordingly, the fourth epitaxial layer 34 only includes silicon. The disposition of the fourth epitaxial layer 34 may compensate for the silicon loss during the metal silicide, such as a nickel silicide process, to sustain the structure completeness of the formed epitaxial layers. The structure of the semiconductor device 36/38/40 is completed. In the present invention, the gas source of germanium (Ge) is added into the epitaxial growth processes used for completely forming epitaxial layers providing tensile stress, for example, silicon-carbide (SiC) layer or phosphorous doped silicon-carbide (SiCP) layer, on the silicon wafer, and the formed epitaxial layer may simultaneously include silicon, carbon, phosphorous and germanium. Accordingly, the present invention is preferably integrated into the NMOS process in order to form epitaxial layers used to provide tensile stress having a predetermined shape, in other words, the formed semiconductor device 36/38/40 preferably serve as NMOS.

Figure 5:
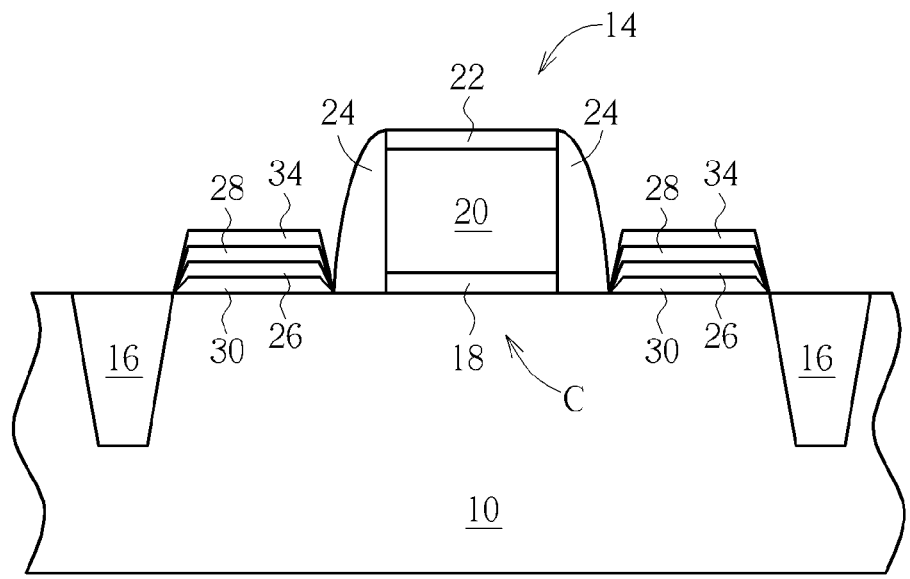
FIG. 5 illustrates a method of forming an epitaxial layer according to an exemplary embodiment of the present invention.
Figure 6:
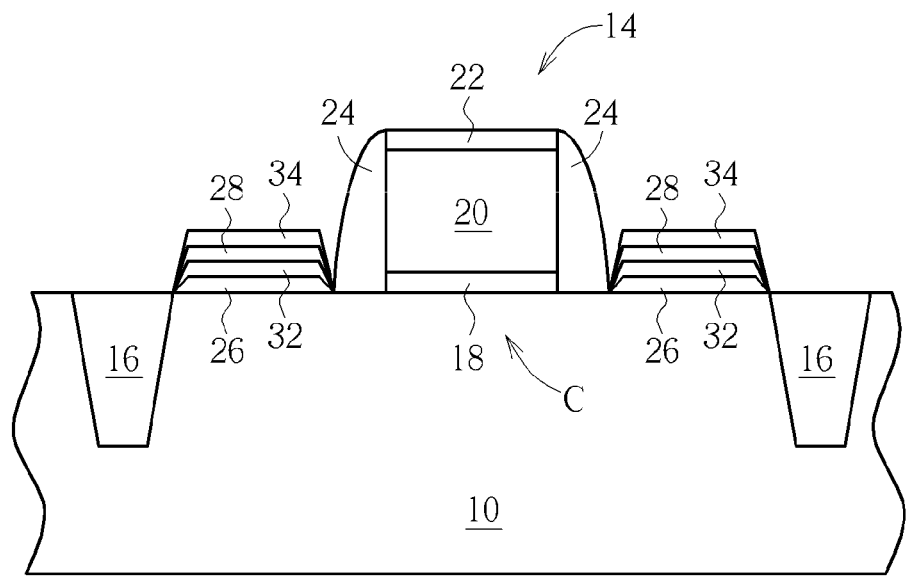
FIG. 6 illustrates a method of forming an epitaxial layer according to an exemplary embodiment of the present invention.

In addition, please refer to FIG. 5 and FIG. 6. FIG. 5 and FIG. 6 illustrate a method of forming an epitaxial layer according to an exemplary embodiment of the present invention. As shown in FIG. 5 and FIG. 6, the first epitaxial layer 26 and the second epitaxial layer 28 are not limited to be formed in the recesses 12, but can be directly formed on the substrate 10 accompanied by the illustrated exemplary embodiments to induce and provide stress to the channel region C.

Please refer to Table. 1 and Table. 2, and to FIG. 3 and FIG. 4 together. Table. 1 and Table. 2 illustrate a reference of material of an epitaxial layer according to an exemplary embodiment of the present invention. As shown in Table. 1 and Table. 2, an epitaxial layer is provided in the present invention. The epitaxial layer includes the first epitaxial layer 26, the second epitaxial layer 28, the third epitaxial layer 30/32 and the fourth epitaxial layer 34 disposed on the substrate 10 or in the recess 12. Each epitaxial layer can be formed through respective in-situ epitaxial growth processes including different types of element source gas. The first epitaxial layer 26 substantially includes four elements such as silicon, carbon, phosphorous and germanium, the material of the first epitaxial layer 26 can be denoted as $(SiC_xP_yGe_z)$, and the value of x is preferably substantially larger than the value of z to provide the tensile stress to the channel region C of the semiconductor device such as NMOS. Furthermore, an atomic radius ratio of germanium to silicon is substantially smaller than an atomic radius ratio of carbon to silicon and an atomic radius ratio of phosphorous to silicon, which may be beneficial to the proper formation of the first epitaxial layer 26 on the (111) crystallographic planes of the silicon wafer. Accordingly, the first epitaxial layer 26 may have a predetermined shape. The second epitaxial layer 28 is disposed on the first epitaxial layer 26, and the number of elements in the second epitaxial layer 28 is smaller than the number of elements in the first epitaxial layer 26. The second epitaxial layer 28 may substantially include two elements such as silicon and phosphorous, or three elements such as silicon, phosphorous and germanium. The third epitaxial layer 30/32 is disposed under the first epitaxial layer 26 or between the first epitaxial layer 26 and the second epitaxial layer 28, and the number of elements in the third epitaxial layer 30/32 is smaller than the number of elements in the first epitaxial layer 26. The third epitaxial layer 30/32 may substantially include three elements such as silicon, carbon and phosphorous, or silicon, carbon and germanium. The fourth epitaxial layer 34 is disposed on the first epitaxial layer 26, the second epitaxial layer 28, and the third epitaxial layer 30/32, and the fourth epitaxial layer 34 only includes silicon to serve as a protective layer. Moreover, the first epitaxial layer 26 and/or the third epitaxial layer 30/32 may have a graded doped concentration of carbon. For example, as the third epitaxial layer 30 is disposed under the first epitaxial layer 26, the doped concentration of carbon in the third epitaxial layer 30 increases progressively from the bottom B of the third epitaxial layer 30 towards the interface between the first epitaxial layer 26 and the third epitaxial layer 30, and/or the doped concentration of carbon in the first epitaxial layer 26 increases progressively from the interface between the first epitaxial layer 26 and the third epitaxial layer 30 towards an interface between the first epitaxial layer 26 and the second epitaxial layer 28.

TABLE 1

| Epitaxial layer | Element types | Element types | Element types |
|---|---|---|---|
| The fourth epitaxial layer | silicon | silicon | silicon |
| The second epitaxial layer | silicon, phosphorous | silicon, phosphorous | silicon, phosphorous, germanium |
| The first epitaxial layer | silicon, carbon, phosphorous, germanium | silicon, carbon, phosphorous, germanium | silicon, carbon, phosphorous, germanium |
| The third epitaxial layer | silicon, carbon, phosphorous | silicon, carbon, germanium | silicon, carbon, germanium |

TABLE 2

| Epitaxial layer | Element types |
|---|---|
| The fourth epitaxial layer | silicon |
| The second epitaxial layer | silicon, phosphorous |
| The third epitaxial layer | silicon, carbon, phosphorous |
| The first epitaxial layer | silicon, carbon, phosphorous, germanium |

In conclusion, the element such as germanium (Ge) having an atomic radius substantially around an atomic radius of silicon (Si) is doped into phosphorous doped silicon-carbide (SiCP) layer to form an epitaxial layer simultaneously including silicon, carbon, phosphorous and germanium, in order to compensate lattice mismatches due to the atomic differences between silicon and carbon and between silicon and phosphorous The epitaxial layer having four elements can therefore be formed properly on the (111) crystallographic planes of the silicon wafer, and a predetermined shape of the epitaxial layer may be obtained. Moreover, the epitaxial layer process can be applied to the source/drain process to improve the metal-oxide-semiconductor (MOS) transistor performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An epitaxial layer, comprising:
a first epitaxial layer, wherein the first epitaxial layer comprises silicon, carbon, phosphorous and germanium;
a second epitaxial layer disposed on the first epitaxial layer, wherein a number of elements in the second epitaxial layer is smaller than a number of elements in the first epitaxial layer;
a third epitaxial layer disposed under the second epitaxial layer, wherein the third epitaxial layer has a doped concentration of carbon and phosphorus; and
a fourth epitaxial layer disposed on the top surface of the second epitaxial layer and overlaps the second epitaxial layer entirely, wherein the fourth epitaxial layer only comprises silicon.

2. The epitaxial layer according to claim 1, wherein the second epitaxial layer comprises silicon and phosphorous.

3. The epitaxial layer according to claim 2, wherein the second epitaxial layer further comprises germanium.

4. The epitaxial layer according to claim 1, wherein a number of elements in the third epitaxial layer is smaller than the number of elements in the first epitaxial layer.

5. The epitaxial layer according to claim 4, wherein the third epitaxial layer is disposed under the first epitaxial layer or between the first epitaxial layer and the second epitaxial layer.

6. The epitaxial layer according to claim 4, wherein the third epitaxial layer is disposed under the first epitaxial layer, and the doped concentration of carbon in the third epitaxial layer increases progressively from a bottom of the third epitaxial layer towards an interface between the first epitaxial layer and the third epitaxial layer.

7. The epitaxial layer according to claim 6, wherein a doped concentration of carbon in the first epitaxial layer increases progressively from the interface between the first epitaxial layer and the third epitaxial layer towards an interface between the first epitaxial layer and the second epitaxial layer.

8. The epitaxial layer according to claim 1, wherein a material of the first epitaxial layer comprising silicon, carbon, phosphorous and germanium is denoted as ($SiC_xP_yGe_z$), and a value of x is substantially larger than a value of z.

* * * * *